(12) United States Patent
Naito et al.

(10) Patent No.: US 11,387,375 B2
(45) Date of Patent: Jul. 12, 2022

(54) GRAPHENE-CONTAINING MEMBRANE, PROCESS FOR PRODUCING THE SAME, GRAPHENE-CONTAINING MEMBRANE LAMINATE AND PHOTOELECTRIC CONVERSION DEVICE

(71) Applicants: KABUSHIKI KAISHA TOSHIBA, Minato-ku (JP); TOSHIBA ENERGY SYSTEMS & SOLUTIONS CORPORATION, Kawasaki (JP)

(72) Inventors: Katsuyuki Naito, Bunkyo (JP); Naomi Shida, Minato (JP); Yutaka Saita, Yokohama (JP)

(73) Assignees: KABUSHIKI KAISHA TOSHIBA, Minato-ku (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 25 days.

(21) Appl. No.: 17/008,706

(22) Filed: Sep. 1, 2020

(65) Prior Publication Data
US 2020/0395491 A1 Dec. 17, 2020

Related U.S. Application Data

(63) Continuation of application No. PCT/JP2019/008551, filed on Mar. 5, 2019.

(51) Int. Cl.
*H01L 31/028* (2006.01)
*H01L 31/0256* (2006.01)
(Continued)

(52) U.S. Cl.
CPC .. *H01L 31/0256* (2013.01); *H01L 31/022475* (2013.01); *H01L 31/1884* (2013.01);
(Continued)

(58) Field of Classification Search
CPC ............ H01L 31/022475; H01L 31/028
See application file for complete search history.

(56) References Cited

U.S. PATENT DOCUMENTS

| 8,703,090 B2 | 4/2014 | Tour et al. |
| 8,907,352 B2 | 12/2014 | Naito |

(Continued)

FOREIGN PATENT DOCUMENTS

| CN | 107039588 | 8/2018 |
| JP | 2012-500179 A | 1/2012 |

(Continued)

OTHER PUBLICATIONS

International Search Report dated May 7, 2019 in PCT/JP2019/008551 filed on Mar. 5, 2019 (with English Translation of Categories of Cited Documents), citing documents AB, AO-AS & AXX-AY therein, 4 pages.

(Continued)

*Primary Examiner* — Jae Lee
(74) *Attorney, Agent, or Firm* — Oblon, McClelland, Maier & Neustadt, L.L.P.

(57) ABSTRACT

The embodiment provides a graphene-containing membrane producible by wet-coating and excellent in electric properties, a process for producing the membrane, a graphene-containing membrane laminate, and a photoelectric conversion device using the graphene-containing membrane. The graphene-containing membrane contains graphene having a graphene skeleton combined with polyalkyleneimine chains. The membrane has a ratio of the photoelectron intensity at the energy peak position of C1s orbital to that at the bonding energy on an X-ray photoelectron spectrum measured on an ITO film of 288 eV in a range of 5.5 to 20. This membrane can be produced by heating a graphene oxide-containing film in the presence of polyalkyleneimine and further heating the film in the presence of a reducing agent. The (Continued)

graphene-containing membrane can be so installed in a photoelectric conversion device that it is placed between the photoelectric conversion layer and the electrode.

8 Claims, 7 Drawing Sheets

(51) Int. Cl.
*H01L 31/0224* (2006.01)
*H01L 31/18* (2006.01)
*H01L 51/00* (2006.01)
*H01L 51/44* (2006.01)

(52) U.S. Cl.
CPC ........ *H01L 51/0037* (2013.01); *H01L 51/442* (2013.01); *H01L 2031/0344* (2013.01)

(56) References Cited

U.S. PATENT DOCUMENTS

| 9,105,696 | B1 | 8/2015 | Dow et al. | |
|---|---|---|---|---|
| 2011/0220191 | A1 | 9/2011 | Flood | |
| 2014/0054550 | A1* | 2/2014 | Hong | B82Y 40/00 257/29 |
| 2014/0103255 | A1 | 4/2014 | Barron et al. | |
| 2016/0111180 | A1* | 4/2016 | Joo | H01B 1/04 73/31.06 |
| 2016/0233357 | A1 | 8/2016 | Lee et al. | |
| 2017/0077402 | A1 | 3/2017 | Oooka et al. | |
| 2017/0125171 | A1 | 5/2017 | Lee et al. | |
| 2017/0321321 | A1 | 11/2017 | Lock et al. | |
| 2017/0338045 | A1 | 11/2017 | Vak et al. | |

FOREIGN PATENT DOCUMENTS

| JP | 2012-089786 A | 5/2012 |
|---|---|---|
| JP | 2013-051335 A | 3/2013 |
| JP | 2013-211212 A | 10/2013 |
| JP | 2014-170826 A | 9/2014 |
| JP | 2014-526430 A | 10/2014 |
| JP | 2017-135379 A | 8/2017 |
| JP | 2018-046219 A | 3/2018 |

OTHER PUBLICATIONS

Zhou et al., "A Universal Method to Produce Low-Work Function Electrodes for Organic Electronics", Science, vol. 336, No. 6079, Apr. 20, 2012, pp. 327-332.

Bausi et al., "Thermal treatment and chemical doping of semi-transparent graphene films", Organic Electronics, vol. 18, Mar. 2015, pp. 53-60.

Zhang et al., "Efficient flexible polymer solar cells based on solution—processed reduced graphene oxide—Assisted silver nanowire transparent electrode", Organic Electronics 50 (2017), pp. 255-263.

* cited by examiner

GRAPHENE-CONTAINING MEMBRANE, PROCESS FOR PRODUCING THE SAME, GRAPHENE-CONTAINING MEMBRANE LAMINATE AND PHOTOELECTRIC CONVERSION DEVICE

CROSS REFERENCE TO RELATED APPLICATIONS

This application is based upon and claims the benefit of priority from the prior International Patent Application PCT/JP2019/008551, filed on Mar. 5, 2019, the entire contents of which are incorporated herein by reference.

FIELD

Embodiments of the present disclosure relate to a graphene-containing membrane, a process for producing the membrane, a graphene-containing membrane laminate, and a photoelectric conversion device.

BACKGROUND

According to recent increasing of energy consumption, demand for alternative energy replacing fossil energy has been rising as measures to cope with global warming. As a source of the alternative energy, solar cells have been attracted the attention and hence progressively developed. They are studied for various practical applications. From a practical viewpoint, it is particularly desired to improve their flexibility and durability so that they can be installed on various places. However, single crystal silicon solar cells, which are the most basic solar cells, are expensive in cost and it is difficult to produce flexible ones. On the other hand, organic solar cells and organic-inorganic hybrid solar cells, in which many researchers have been lately interested, have room for improvement in durability.

In addition to the above solar cells, other photoelectric conversion devices, such as organic EL devices and photosensors, have been also researched with the aim of improving their flexibility and durability. Those devices usually comprise ITO films as transparent electrodes. The ITO films are normally formed by sputtering or the like. In order that the ITO films can have high electroconductivity, it is necessary to carry out the sputtering procedure at a high temperature and to anneal thereafter the formed films at a high temperature. However, it is often the case that organic materials cannot be subjected to those procedures at a high temperature. Further, when the ITO films are installed in the devices, metal ions such as indium ion and/or halogen ions may intrude into the active elements such as the photoelectric conversion layers to impair the activity of the devices.

Meanwhile, it is sometimes the case that low-resistant and high-transparent transparent conductive oxide (TCO)/Ag (or an alloy thereof)/TCO or silver nanowires are adopted as the transparent electrodes. However, in those silver-containing electrodes, silver is often deteriorated by acids or halogens. In addition, silver tends to cause migration and, as a result, may react with water and the like to lower the transparency of the electrode or may migrate into the active elements to impair the activity of the devices. Further, during long term operation, metal ions contained in TCO may diffuse to impair the device activity.

There are also some cases in which graphene-containing membranes are adopted as the material of transparent electrode. However, although excellent in electroconductivity and stability, graphene-containing membranes are known to have various disadvantages. Specifically, there are many restrictions on their processing. For example, they need to be produced by CVD and the formed graphene membranes must be treated with hydrazine vapor. Graphene membranes can be also formed by wet-coating, but the resultant graphene-containing membranes often have poor electrical properties and hence photoelectric conversion devices comprising them may have unsatisfying performances.

DETAILED DESCRIPTION

A graphene-containing membrane according to the first embodiment contains graphene in which polyalkyleneimine chains are connected to the graphene skeleton, which has a ratio of the photoelectron intensity at the energy peak position of C1s orbital to that at the bonding energy on an X-ray photoelectron spectrum measured on an ITO film of 288 eV in a range of 5.5 to 20.

A graphene-containing membrane producing process according to the second embodiment comprises, in this order, the steps of:

(a) adding polyalkyleneimine into an aqueous dispersion of graphene oxide, (b) adding a reducing agent into the dispersion obtained in the above step (a), and then heating the dispersion, and (c) coating a substrate with the dispersion obtained in the above step (b).

A graphene-containing membrane laminate according to the third embodiment has a structure comprising a graphene oxide film overlaid on a membrane containing graphene combined with polyalkyleneimine chains.

A photoelectric conversion device according to the fourth embodiment comprises a negative electrode, a positive electrode, a photoelectric conversion layer provided between said negative electrode and said positive electrode, and a graphene-containing membrane provided between said negative electrode and said photoelectric conversion layer; wherein said graphene-containing membrane contains graphene in which polyalkyleneimine chains are connected to the graphene skeleton and has a ratio of the photoelectron intensity at the energy peak position of C1s orbital to that at the bonding energy on an X-ray photoelectron spectrum measured on an ITO film of 288 eV in a range of 5.5 to 20.

A photoelectric conversion device according to the fifth embodiment comprises a negative electrode, a positive electrode, a photoelectric conversion layer provided between said negative electrode and said positive electrode, and such a laminate provided between said positive electrode and said photoelectric conversion layer as has a structure comprising a graphene oxide film overlaid on a membrane containing graphene to which polyalkyleneimine chains are connected from the negative electrode side.

Embodiments will now be explained with reference to the accompanying drawings.

Embodiment 1

First, the structure of a graphene-containing membrane according to the first embodiment is explained with reference to FIG. 1.

A graphene-containing membrane 100 according to the embodiment has a structure in which one to several layers of graphene 101 are piled up.

Figure 1:
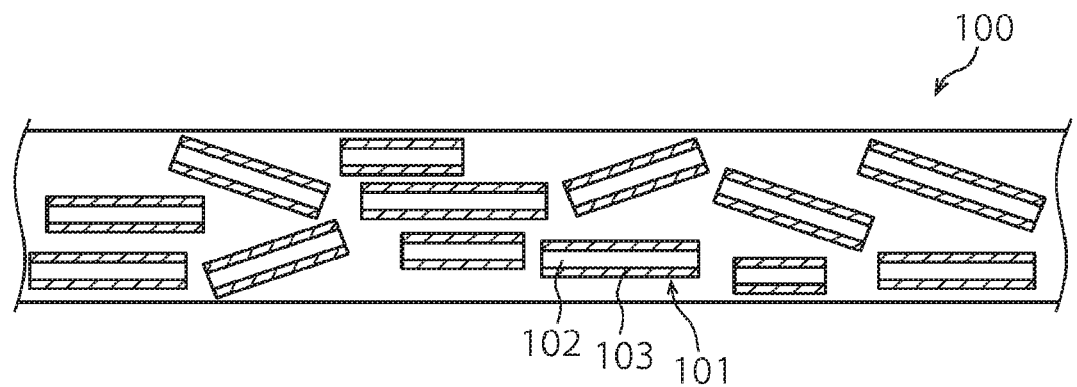
FIG. 1 is a schematic sectional view showing the structure of a graphene-containing membrane according to the first embodiment.

As schematically shown in FIG. 1, the graphene-containing membrane of the embodiment has a structure in which one to several layers of sheet-shaped graphene 101 are piled up. There are no particular restrictions on the number of the piled graphene layers, but the number thereof is preferably one to six, more preferably two to four so as to obtain sufficient transparency, electroconductivity and ion shielding effect.

The above graphene has a structure comprising a graphene skeleton to which polyalkyleneimine chains, for example, represented by the following formula, particularly polyethyleneimine chains are connected. In some cases, carbon atoms in the graphene skeleton are partly replaced with nitrogen atoms.

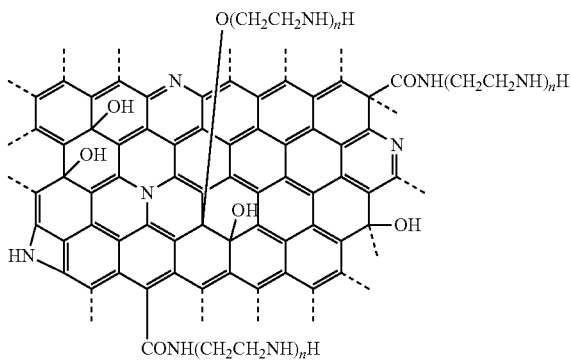

In the above formula, polyethyleneimine chains are shown as an example of the polyalkyleneimine chains. There are no particular restrictions on the number represented by "n", but n is preferably 10 to 1000. Particularly preferred are polyethyleneimine chains of n=100 to 300. It is also possible to adopt branched or cyclic polyalkyleneimine chains, as well as, straight ones.

The graphene shown above can be considered to have a graphene skeleton whose surface is modified with polyalkyleneimine chains. FIG. 1 schematically shows graphene skeletons 102 having surfaces modified with polyalkyleneimine chains 103.

The graphene-containing membrane exhibits a characteristic X-ray photoelectron spectrum (i.e., XPS spectrum). Specifically, when measured on an ITO film, the graphene-containing membrane shows an X-ray photoelectron spectrum in which a ratio of the photoelectron intensity at the energy peak position of C1s orbital ($I_{C1s}$) to that at the bonding energy of 288 eV ($I_{288}$), namely, a ratio of $I_{C1s}/I_{288}$ (hereinafter, referred to as "$R_{C1s}$") is in a range of 5.5 to 20, preferably 6 to 10. The energy peak position of C1s orbital may shift depending on the kind of substituents contained in the graphene-containing membrane, on the content thereof and on the kind of the substrate, but is generally observed at the bonding energy of about 285 eV.

In general, graphene combined with polyalkyleneimine chains has relatively high insulating property and hence tends to have high electric resistance. However, the graphene-containing membrane of the embodiment, which exhibits the above XPS spectrum, contains C—C bonds (including double bonds) in a high ratio as compared with carbonyl carbons and hence tends to have low electric resistance and small work function.

As an XPS (X-ray photoelectron spectroscopy) apparatus employed for evaluation, Quantera SXM ([trademark], manufactured by PHI Inc.) can be adopted, for example. This apparatus is equipped with a single crystal-monochromatized AlKα X-ray source, and the X-ray output and X-ray analysis area can be set at 50 W and ϕ 200 μm, respectively. The pass energy under the measurement condition is set to be 280.0 eV (1.0 eV/step) for wide scan and 69.0 eV (0.125 eV/step) for narrow scan. The apparatus is also equipped with a charge neutralization gun using both Ar$^+$ and e$^-$. As for the geometry, the angle θ (angle between the sample surface and the detector) can be set to be θ=45°. There is an interaction between the substrate and the graphene-containing membrane to be measured, and hence signals in the XPS spectrum may slightly sift depending on the kind of the substrate. In view of that, the XPS signals defined in the embodiment are limited to those obtained by measuring the membrane on an ITO film. As the ITO film, it is possible to adopt, for example, a transparent electrode of ITO/silver alloy/ITO having a surface resistance of about 10 Ω/square (commercially available from OIKE & Co., Ltd.).

When measured on an ITO film, the graphene-containing membrane of the embodiment preferably shows an X-ray photoelectron spectrum indicating the bonding energy of the peak corresponding to N1s orbital (hereinafter, referred to as "$E_{N1s}$") in the range of 399.0 to 399.5 eV. If this condition is satisfied, the membrane tends to contain so many pyridine nitrogen atoms, which are fixed in aromatic rings, that the π-electron system can be expanded enough to lower electric resistance. In addition, if containing many pyridine nitrogen atoms, the membrane tends to have high ability of trapping halogen ions and metal ions.

Further, the graphene-containing membrane of the embodiment preferably has a work function of 4 eV or less, provided that the work function is determined by ultraviolet photoelectron spectroscopy (UPS). If the graphene membrane satisfying this condition is so installed in a photoelectric conversion device that it may be placed between the negative electrode and the photoelectric conversion layer, the negative electrode tends to be improved in function.

The measurement of ultraviolet photoelectron spectroscopy (UPS) is, for example, carried out with Versa Probe ([trademark], manufactured by PHI Inc.) by use of He I line (21.22 eV) as the light source. For the purpose of precisely detecting electrons of low kinetic energy, the sample stage is exposed to a voltage of −13 V during the measurement. Further, in order to determine the fermi edge, a gold reference having a surface beforehand subjected to Ar ion etching (cleaning) is measured.

Embodiment 2

Next, a graphene-containing membrane producing process according to the second embodiment is explained below.

A graphene-containing membrane producing process of the embodiment comprises, in this order, the steps of:
(a) adding polyalkyleneimine into an aqueous dispersion of graphene oxide,
(b) adding a reducing agent into the dispersion obtained in the above step (a), and then heating the dispersion, and
(c) coating a substrate with the dispersion obtained in the above step (b).

The aqueous dispersion of graphene oxide in the above step (a) can be prepared by dispersing graphene oxide in an aqueous medium. The graphene oxide used here contains monolayer graphene oxide sheets in an amount of preferably 80 mass % or more, further preferably 90 mass % or more. If satisfying this condition, the graphene oxide can improve homogeneity of the prepared dispersion and also evenness of the coating film. As the aqueous dispersion medium, water such as pure water or ion-exchanged water is adopted. Further, the medium may contain a small amount of aqueous organic solvent such as methanol or ethanol, if necessary. The content of graphene oxide in the dispersion is preferably 0.01 to 1 mass % based on the total mass of the dispersion.

The mass ratio between the graphene oxide contained in the aqueous dispersion and the polyalkyleneimine to be added therein is preferably 1:3 to 1:20, more preferably 1:7 to 1:15. If the polyalkyleneimine is added in a small amount, dispersibility in the dispersion tends to be lowered. On the other hand, if containing the polyalkyleneimine in a large amount, the resultant film tends to have large electric resistance. The polyalkyleneimine preferably has 2 to 8 carbon atoms in the monomer unit. Examples thereof include polyethyleneimine, polypropyleneimine, and polyethylenepropyleneimine. Among them, polyethyleneimine is preferred. It is also possible to use polyalkyleneimines having various structures, such as, straight chain structure, branched chain structure and cyclic structure. However, polyalkyleneimine of branched chain structure is preferred because it makes easy to improve dispersibility.

Heating time and temperature are so selected that the polyalkyleneimine can react effectively with the graphene oxide. They can be freely determined according to other conditions, but the mixture is generally heated at 80 to 100° C. for 30 to 180 minutes.

The reducing agent used in the above step (b) is not particularly restricted unless it impairs the effect of the embodiment. The agent is hence selected from reductants capable of working effectively in aqueous dispersions. Example thereof include hydrazine hydrate and sodium borohydride, and hydrazine hydrate is preferred because it provides an appropriate reaction rate.

When hydrazine hydrate is adopted as the reducing agent, the mass ratio between the graphene oxide and the added hydrazine hydrate is preferably 1:10 to 1:200. If the amount of hydrazine hydrate is small, the graphene oxide is reduced so insufficiently that the resultant graphene-containing membrane tends to have large electric resistance. On the other hand, however, if hydrazine hydrate is added in a large amount, it results in increase of unreacted hydrazine hydrate necessary to be removed after the reaction.

In the embodiment, it is necessary to carry out the step (b) after the step (a). If the order of those steps is reversed, it is difficult to obtain the aimed graphene-containing membrane.

As the result of the steps (a) and (b), the aimed graphene is formed in the dispersion. In the step (c), the obtained dispersion can be directly applied on a substrate or the like to produce the graphene-containing membrane of the embodiment. However, if necessary, the dispersion also can be subjected to washing or dispersion medium replacement.

The washing procedure (step (b')) can be carried out, for example, in a manner where graphene formed as the product is separated from the obtained dispersion and then washed with water or the like. Specifically, the dispersion obtained in the step (b) is centrifuged to precipitate formed graphene, which is then recovered and again dispersed in water. This procedure may be repeated twice or more. When graphene is to be precipitated with centrifugation, the condition thereof is preferably 8000 to 15000 rpm. If the rotation rate is small, the yield of the precipitate tends to be lowered. On the other hand, if the rate is large, the precipitate is liable to be contaminated with impurities.

Prior to the step (c), the precipitated graphene obtained in the step (b') is preferably dispersed in a dispersion medium to prepare a coating solution (step (b'')). Examples of the dispersion medium include water and alcohols. However, as the dispersion medium of the coating solution, low molecular alcohols having 1 to 4 carbon atoms are preferred and ethanol or 2-propanol is more preferred. Among them, in view of dispersion stability and safety, ethanol is particularly preferred.

The reason of that is as follows. Since having a graphene skeleton combined with polyalkyleneimine chains, the graphene of the embodiment tends to have high dispersibility in alcohols. In addition, alcohols have smaller surface tension than water, and accordingly the graphene dispersion of alcohol medium has the advantage of easily coating various substrates.

Subsequently, the obtained dispersion is applied on a substrate (step (c)). In the step (c), the dispersion is preferably applied by bar-coating method. Among various bar-coating processes, it is preferred to adopt a process comprising the steps of: supplying the dispersion into a gap between the substrate and an applicator, so as to form a meniscus between them; and then sliding the substrate or bar-coater to coat said substrate. (Hereinafter, this process is referred to as "meniscus coating process".) In the meniscus coating process, the film thickness can be precisely controlled by adjusting the dispersion concentration, coating speed and meniscus height. Further, this process can be used for large-area coating such as roll-to-roll coating.

Successively to the step (c), the formed film can be dried according to necessity.

After the graphene-containing membrane is formed, a dispersion of graphene oxide may be further applied thereon to form a graphene oxide film on the graphene-containing membrane of the embodiment. Here, the graphene oxide film is different from the graphene-containing membrane of the embodiment in that the graphene oxide film is not modified. The unmodified graphene oxide film can increase the work function and also enhance the ion-shielding of the composite laminate. If an aqueous dispersion of graphene oxide is adopted for forming the graphene oxide film, it is easily to form the film evenly because the aqueous dispersion has high affinity with the underlying graphene-containing membrane. However, graphene oxide may be dispersed and applied in an organic solvent such as methanol or ethanol.

Embodiment 3

Figure 2:
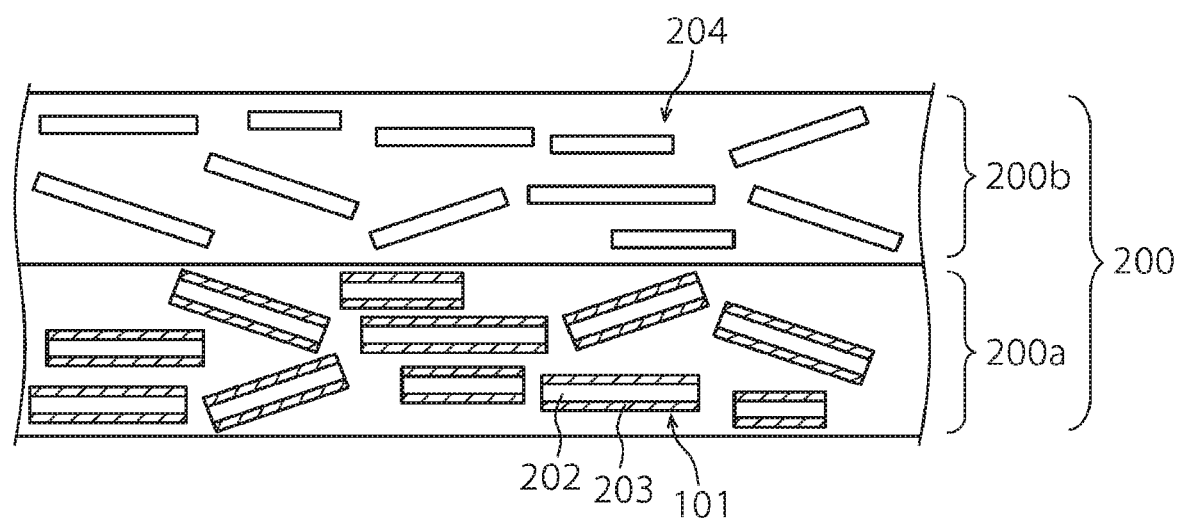
FIG. 2 is a schematic sectional view showing the structure of a graphene-containing membrane laminate according to the third embodiment.

The structure of a graphene-containing membrane laminate (hereinafter, often simply referred to as "laminate") according to the third embodiment is then explained with reference to FIG. 2. FIG. 2 is a schematic sectional view showing the structure of a laminate 200 of the embodiment. The laminate 200 has a structure comprising a graphene-containing membrane 200a and a graphene oxide film 200b overlaid thereon.

As schematically shown in FIG. 2, the graphene-containing membrane 200a has a structure in which one to several layers of sheet-shaped graphene 201 are piled up. The graphene 201 has a graphene skeleton to which polyalkyleneimine chains are connected. In other words, the graphene skeleton can be considered to have a surface modified with polyalkyleneimine chains. FIG. 2 schematically shows graphene skeletons 202 having surfaces modified with polyalkyleneimine chains 203. The membrane containing graphene combined with polyalkyleneimine chains generally has a small work function, and hence is suitable as a positive electrode material. However, when the graphene oxide film, which tends to be negatively charged, is overlaid thereon, the work function tends to increase depending on orientation of the dipoles and consequently the laminate becomes suitable as a negative electrode material. Further, the graphene oxide film also tends to enhance anion-shielding ability.

The graphene oxide film 200b has a structure in which sheets of graphene oxide 204 are piled up as schematically shown in FIG. 2. The graphene oxide film preferably comprises piled one to eight layers of sheet-shaped graphene oxide. The less layers are piled up, the less the work function tends to increase. Further, the more layers are piled up, the more the electric resistance tends to increase. The number of the piled layers is preferably 2 to 4. The ratio between carbon atoms and oxygen atoms in graphene oxide is 1:0.2 to 1:0.8. If the ratio of oxygen atoms is smaller than 0.2, the film tends to be impaired in transparency and also the work function is liable to less increase. On the other hand, if it is larger than 0.8, the electric resistance tends to increase.

It is possible to adopt a graphene-containing membrane which has a ratio of the photoelectron intensity at the energy peak position of C1s orbital to that at the bonding energy on an X-ray photoelectron spectrum measured on an ITO film of 288 eV in a range of 5.5 to 20. If that membrane is employed, the laminate tends to have both low electric resistance and small work function.

The work function, which is determined by ultraviolet photoelectron spectroscopy, of the laminate can be controlled to be 4.5 eV or more, and thereby the laminate tends to be improved in performance as a positive electrode. The work function is more preferably 4.8 eV or more.

The laminate can be produced in the following manner. Subsequently to the graphene-containing membrane producing process explained above in the second embodiment, the formed graphene-containing membrane is coated with a dispersion of graphene oxide and then dried to produce the laminate. There are no particular restrictions on the conditions of applying the graphene oxide-containing membrane. For example, they are freely selected from conditions usable in coating for producing the graphene-containing membrane. The graphene oxide applied on the graphene-containing membrane may be either the same as a material used for producing the objective graphene-containing membrane or other graphene oxide. When the laminate of the embodiment is to be produced, the step (b) in the graphene-containing membrane producing process can be omitted. This means that the graphene-containing membrane contained in the laminate can be formed without the treatment with a reducing agent.

Embodiment 4-1

Figure 3:
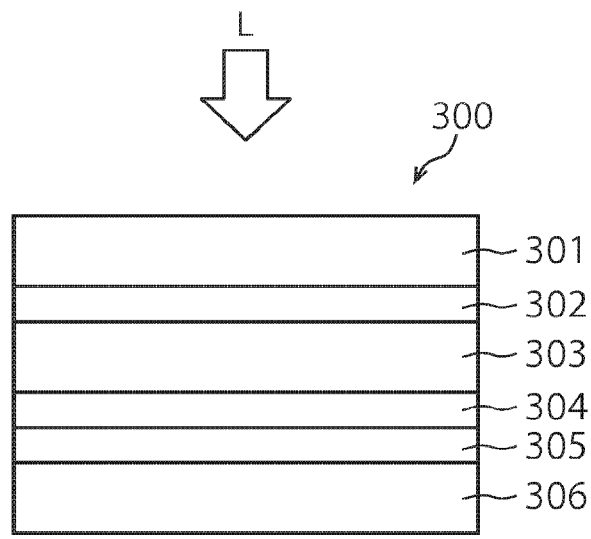
FIG. 3 is a schematic sectional view showing the structure of a photoelectric conversion device (solar cell) according to the fourth embodiment.

The structure of a photoelectric conversion device according to the fourth embodiment is then explained with reference to FIG. 3. FIG. 3 is a schematic sectional view showing the structure of a solar cell 300 (photoelectric conversion device) of the embodiment. The solar cell 300 is a device serving as a solar cell in which light energy such as sunlight L coming thereinto is converted into electric power. The solar cell 300 comprises a transparent electrode 301 functioning as a negative electrode, a photoelectric conversion layer 303, and a graphene-containing membrane 302 provided therebetween. The negative electrode in FIG. 3 is a transparent electrode, but the positive electrode may be a transparent electrode. Further, both electrodes may be transparent electrodes.

The above graphene-containing membrane 302 contains graphene in which polyalkyleneimine chains are connected to the graphene skeleton, which has a ratio of the photoelectron intensity at the energy peak position of C1s orbital to that at the bonding energy on an X-ray photoelectron spectrum measured on an ITO film of 288 eV in a range of 5.5 to 20. This graphene-containing membrane tends to improve not only the efficiency but also the working lifetime of the device. The graphene-containing membrane 302 preferably has a work function of 4 eV or less.

The above photoelectric conversion device can have an electrode containing silver. For example, the electrode may have a structure comprising an ultrathin silver or silver alloy film sandwiched between transparent conductive oxide films, or otherwise may contain silver- or silver alloy-nanowires. If one electrode is transparent, the other may be a non-transparent silver electrode.

The silver alloy is preferably silver with Pd, Pt, Au, Sn, Zn or Cu. The silver nanowires preferably has an average diameter of 20 to 200 nm. If the diameter is smaller than 20 nm, the stability tends to be lowered. On the other hand, if it is larger than 200 nm, the transparency tends to be lowered. The thickness of the ultrathin film and the diameter of nanowires can be determined in the same manner as described above.

The transparent conductive oxide film can be desirably selected from films of generally-known oxides. Examples thereof include: indium-doped tin oxide ITO, fluorine-doped tin oxide FTO, and aluminum-doped zinc oxide AZO. Those metal oxides contain amorphous structures, and the films thereof preferably have thicknesses of 30 to 200 nm. Since they have amorphous structures, it is easy to continuously form even and flat films from them. If the thickness is less than 30 nm, the film tends to have large resistance. On the other hand, if the thickness is more than 200 nm, the film tends to have poor transparency and it tends to take a long time to form the film. The thickness is more preferably 35 to 100 nm, further preferably 40 to 70 nm. Among the above oxides, ITO is preferred because the zeta potential thereof in neutral pH is so near to zero as to have small interaction with cations and anions.

The ultrathin silver or silver alloy film preferably has a thickness of 2 to 20 nm. If it is less than 2 nm, the film tends to have large resistance. On the other hand, if it is more than 20 nm, the film tends to have poor transparency. The thickness is more preferably 3 to 15 nm, further preferably 5 to 10 nm.

When measured on an ITO film, the graphene-containing membrane of the embodiment preferably shows an X-ray photoelectron spectrum indicating the bonding energy of the peak corresponding to N1s orbital in the range of 399.0 to 399.5 eV. If this condition is satisfied, the membrane tends to contain so many pyridine nitrogen atoms, which are fixed in aromatic rings, that the n-electron system can be expanded enough to lower electric resistance. In addition, if containing many pyridine nitrogen atoms, the membrane tends to have high ability of trapping halogen ions and metal ions.

The photoelectric conversion device according to the embodiment can further comprise a UV-cut layer or a gas-barrier layer. Examples of ultraviolet absorbers contained in the UV-cut layer include: benzophenones, such as, 2-hydroxy-4-methoxybenzophenone, 2,2-dihydroxy-4-methoxybenzophenone, 2-hydroxy-4-methoxy-2-carboxy-benzophenone, and 2-hydroxy-4-n-octoxybenzophenone; benzotriazoles, such as, 2-(2-hydroxy-3,5-di-t-butylphenyl) benzotriazole, 2-(2-hydroxy-5-methylphenyl)benzotriazole, and 2-(2-hydroxy-5-t-octylphenyl)benzotriazole; and salicylic esters, such as, phenyl salicylate and p-octylphenyl salicylate. The absorbers are preferably capable of cutting UV light in the wavelength range of 400 nm or less.

The gas-barrier layer blocks preferably water vapor and oxygen, particularly preferably water vapor. This layer is preferably, for example, a film of inorganic substance such as SiN, $SiO_2$, SiC, $SiO_xN_y$, $TiO_2$ or $Al_2O_3$. Further, it may be an ultrathin glass sheet. There are no particular restrictions on the thickness of the gas-barrier layer, but the thickness is preferably 0.01 to 3000 μm, more preferably 0.1 to 100 μm. If it is less than 0.01 μm, the layer often cannot serve fully as a barrier against gases. On the other hand, if the thickness is more than 3000 μm, the layer tends to be too thick to ensure flexibility or bendability. The gas-barrier layer has a water-vapor permeability (moisture permeability) of preferably $10^2$ to $10^{-6}$ g/m$^2$·d, more preferably $10^1$ to $10^{-5}$ g/m$^2$·d, further preferably 100 to $10^{-4}$ g/m$^2$·d, still preferably $10^{-1}$ to $10^{-4}$ g/m$^2$·d. The moisture permeability can be measured according to JIS Z0208 and the like. The gas-barrier layer is preferably formed by dry processes. Examples of the dry processes for forming the gas-barrier layer include: vacuum deposition processes, such as, resistance heating deposition, electron beam deposition, induction heating deposition, and plasma or ion-beam assisted deposition thereof; sputtering processes, such as, reactive sputtering, ion beam sputtering, and ECR (electron cyclotron resonance) sputtering; PVD (physical vapor deposition) processes, such as, ion plating; and CVD (chemical vapor deposition) processes employing heat, light or plasma. Among them, preferred are vacuum deposition processes, in which a film of the layer is formed by deposition in vacuum.

The substrate used in the device of the embodiment is, for example, a transparent substrate made of inorganic materials such as glass or of organic materials such as PET, PEN, polycarbonate and PMMA. Further, aluminum foil and SUS foil are also employable. Preferred are flexible materials because they make the photoelectric conversion device of the embodiment rich in flexibility.

The photoelectric conversion layer 303 is a semiconductor layer that converts incident light energy into electric power to generate a current. The conversion layer 303 generally comprises a p-type semiconductor sub-layer and an N-type semiconductor sub-layer. As the photoelectric conversion layer, it is also possible to use: a laminate of p-type polymer and n-type material; an inorganic semiconductor such as perovskite type represented by $ABX_3$ (in which A is a monovalent cation, B is a divalent cation and X is a halogen ion), silicon semiconductor, InGaAs, GaAs, chalcopyrite type, CdTe type, InP type or SiGe type; and a transparent semiconductor such as quantum dots-containing type or dye sensitizing type. Any of the above has enough high efficiency to reduce deterioration of output power.

In order to promote or block charge injection, the device can further comprise a buffer layer between the conversion layer 303 and the transparent electrode 301.

The positive electrode (counter electrode) 306 may be a nontransparent metal electrode, but may be a transparent electrode according to the embodiment. Further, the positive electrode 306 may be an ITO glass transparent electrode. In that case, although flexibility is sacrificed, the conversion device can utilize light energy at high efficiency. It is also possible to adopt a metal electrode made of stainless steel, copper, titanium, nickel, chromium, tungsten, gold, silver, molybdenum, tin and/or zinc. That electrode tends to have impaired transparency.

The device can furthermore comprise a second graphene-containing layer 305, a charge buffer layer or a charge transport layer between the conversion layer 303 and the positive electrode 306.

The buffer or charge transport layer for positive electrode may be, for example, a layer of vanadium oxide, PEDOT/PSS, P-type polymer, vanadium pentoxide ($V_2O_5$), 2,2',7,7'-tetrakis[N,N-di(4-methoxyphenyl)amino]-9,9'-spirobifluorene (hereinafter, referred to as "Spiro-OMeTAD"), nickel oxide (NiO) or molybdenum trioxide ($MoO_3$).

On the other hand, the buffer or charge transport layer for negative electrode may be, for example, a layer of lithium fluoride (LiF), calcium (Ca), 6,6'-phenyl-C61-butyric acid methyl ester (C60-PCBM), 6,6'-phenyl-C71-butyric acid methyl ester (hereinafter, referred to as "C70-PCBM"), indene-C60 bisadduct (hereinafter, referred to as "ICBA"), cesium carbonate ($Cs_2CO_3$), titanium dioxide ($TiO_2$), poly [(9,9-bis(3'-(N,N-dimethylamino)propyl)-2,7-fluorene)-alt-2,7-(9,9-dioctyl-fluorene)] (hereinafter, often referred to as "PFN"), bathocuproine (hereinafter, often referred to as "BCP"), zirconium oxide (ZrO), zinc oxide (ZnO), tungsten trioxide ($WO_3$) or polyethyneimine.

Further, the device can be equipped with a metal oxide layer between the conversion layer and the transparent electrode layer, in particular, adjacently to the graphene-containing membrane. The metal oxide layer is, for example, a brookite-type titanium oxide layer or a tin oxide layer. Titanium oxide is known to have three types of crystal structures, namely, rutile-type, anatase-type and brookite-type. Among them, it is preferred to employ a layer containing brookite-type titanium oxide in the embodiment. The brookite-type titanium oxide layer has an effect of inhibiting migration of halogen from the conversion layer to the electrode and also migration of metal ions from the electrode to the conversion layer. Consequently, it makes possible to extend the lifetime of the electrode and the device. The brookite-type titanium oxide layer preferably comprises nanoparticles of brookite-type titanium oxide, specifically, particles thereof having a mean size of 5 to 30 nm. Here, the mean size is determined with a grain-size distribution measuring apparatus. Those brookite-type nanoparticles are commercially available from, for example, Kojundo Chemical Lab. Co., Ltd. The tin oxide layer can be formed in a manner where a solution of tin oxide dissolved in n-butanol is applied and then heated under a high humid condition.

The photoelectric conversion device of the embodiment can have a structure sandwiched between transparent electrodes. The solar cell having that structure can efficiently utilize light incident from both sides. The energy conversion efficiency thereof is generally 5% or more.

The photoelectric conversion device according to the present embodiment can be used not only as a photocell or solar cell but also as a photosensor.

Embodiment 4-2

Figure 4:
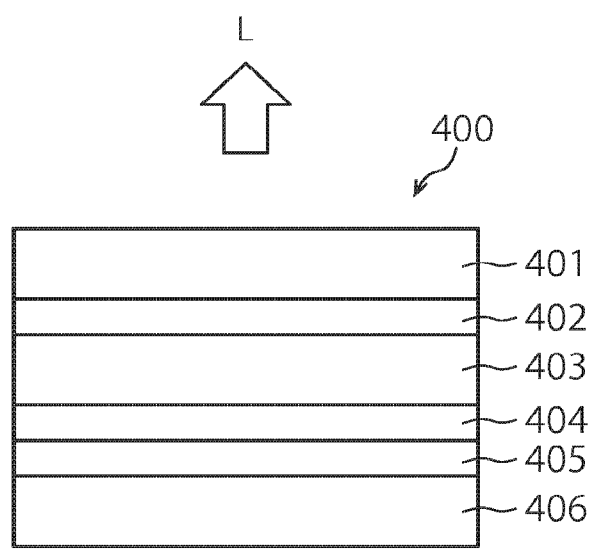
FIG. 4 is a schematic sectional view showing the structure of another photoelectric conversion device (organic EL device) according to the fourth embodiment.

With reference to FIG. 4, the structure of another photoelectric conversion device according to the fourth embodiment is explained below. FIG. 4 is a schematic sectional view showing an organic EL device 400 (photoelectric conversion device) according to the present embodiment. The organic EL device 400 is a device serving as a light-emitting element in which electric energy inputted thereinto is converted into light L. The organic EL device 400 comprises a transparent electrode 401 functioning as a negative electrode, a photoelectric conversion layer 403, and a graphene-containing membrane 402 provided therebetween. The negative electrode in FIG. 4 is a transparent electrode, but the positive electrode may be a transparent electrode. Further, both electrodes may be transparent electrodes.

The device can furthermore comprise a second graphene-containing layer 405, graphene oxide film 404, a charge buffer layer or a charge transport layer between the conversion layer 403 and the negative electrode 406.

The above graphene-containing membrane 402 contains graphene in which polyalkyleneimine chains are connected to the graphene skeleton, which has a ratio of the photoelectron intensity at the energy peak position of C1s orbital to that at the bonding energy on an X-ray photoelectron spectrum measured on an ITO film of 288 eV in a range of 5.5 to 20. This graphene-containing membrane tends not only to reduce the driving voltage but also to extend the working lifetime.

In the X-ray photoelectron spectrum shown by the graphene-containing membrane measured on an ITO film, the bonding energy corresponding to N1s orbital is preferably in the range of 399.0 to 399.5 eV. Further, the graphene-containing membrane 402 preferably has a work function of 4 eV or less.

The substrate used in the device of the embodiment is, for example, a transparent substrate made of inorganic materials such as glass or of organic materials such as PET, PEN, polycarbonate and PMMA. Further, aluminum foil and SUS foil are also employable. Preferred are flexible materials because they make the photoelectric conversion device of the embodiment rich in flexibility.

Embodiment 5-1

Figure 5:
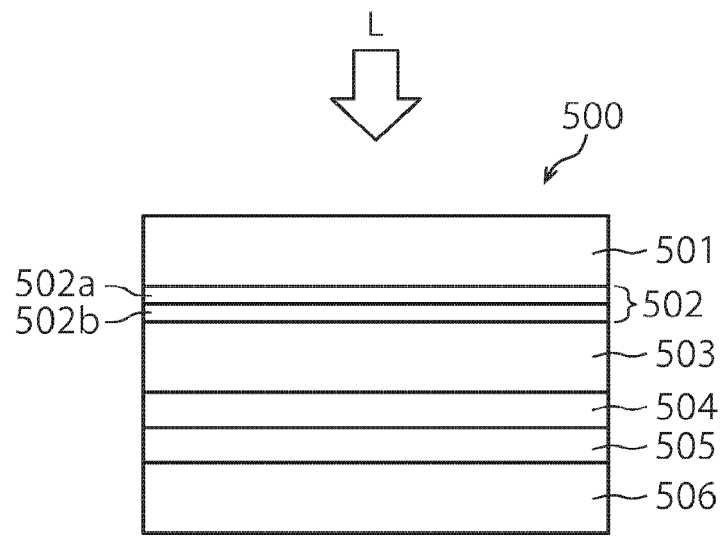
FIG. 5 is a schematic sectional view showing the structure of a photoelectric conversion device (solar cell) according to the fifth embodiment.

With reference to FIG. 5, the structure of a photoelectric conversion device according to the fifth embodiment is then explained below. FIG. 5 is a schematic sectional view showing the structure of a solar cell 500 (photoelectric conversion device) of the embodiment. The solar cell 500 is a device serving as a solar cell in which light energy such as sunlight L coming thereinto is converted into electric power. The solar cell 500 comprises a transparent electrode 501 functioning as a positive electrode, a photoelectric conversion layer 503, and a laminate 502 which is provided therebetween and which contains a graphene-containing membrane 502a and a graphene oxide film 502b. The positive electrode in FIG. 5 is a transparent electrode, but the negative electrode may be a transparent electrode. Further, both electrodes may be transparent electrodes.

The device can furthermore comprise a second graphene-containing layer 505, graphene oxide film 504, a charge buffer layer or a charge transport layer between the conversion layer 503 and the positive electrode 506.

The membrane 502a contains graphene combined with polyalkyleneimine chains, and generally has a work function small enough to be suitable as a negative electrode material. However, when the graphene oxide film 502b, which tends to be negatively charged, is overlaid thereon, the work function tends to increase depending on orientation of the dipoles and consequently the laminate becomes suitable as a positive electrode material. Further, the graphene oxide film also tends to enhance anion-shielding ability.

Embodiment 5-2

Figure 6:
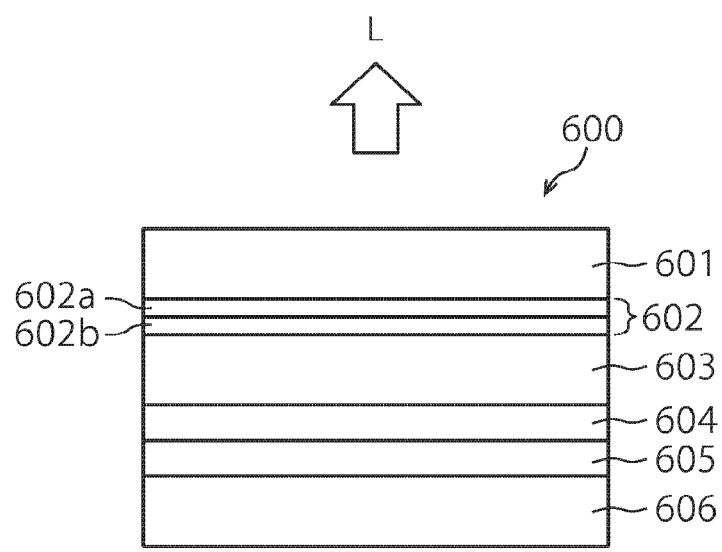
FIG. 6 is a schematic sectional view showing the structure of another photoelectric conversion device (organic EL device) according to the fifth embodiment.

With reference to FIG. 6, the structure of another photoelectric conversion device according to the fifth embodiment is then explained below. FIG. 6 is a schematic sectional view showing the structure of an organic EL device 600 (photoelectric conversion device) according to the present embodiment. The organic EL device 600 is a device serving as a light-emitting element in which electric energy inputted thereinto is converted into light L. The organic EL device 600 comprises a transparent electrode 601 functioning as a positive electrode, a photoelectric conversion layer 603, and a laminate 602 which is provided therebetween and which contains a graphene-containing membrane 602a and a graphene oxide film 602b. The positive electrode in FIG. 6 is a transparent electrode, but the negative electrode may be a transparent electrode. Further, both electrodes may be transparent electrodes.

The device can furthermore comprise a second graphene-containing layer 605, graphene oxide film 604, a charge buffer layer or a charge transport layer between the conversion layer 603 and the negative electrode 606.

The graphene-containing membrane 602a contains graphene combined with polyalkyleneimine chains, and generally has a work function small enough to be suitable as a negative electrode material. However, when the graphene oxide film 602b, which tends to be negatively charged, is overlaid thereon, the work function tends to increase depending on orientation of the dipoles and consequently the laminate becomes suitable as a positive electrode material. Further, the graphene oxide film also tends to enhance anion-shielding ability.

EXAMPLES

The embodiments are explained below by use of the following examples.

Example 1

Into 30 g of a graphene oxide aqueous dispersion containing monolayer graphene oxide sheets in an amount of 80 mass % or more (concentration: 0.05 wt %), 2 g of a branched polyethyleneimine aqueous solution (concentration: 10 wt %) is added. The mixture is heated at 90° C. for 1 hour, then 2 g of hydrazine hydrate is added therein, and thereafter the mixture is further heated at 90° C. for 1 hour. The resultant mixture is centrifuged at 12000 rpm to obtain precipitates, which are then dispersed again in water. The dispersion is centrifuged at 12000 rpm to obtain precipitates. This procedure is repeated twice to remove unreacted polyethyleneimine and hydrazine hydrate. The obtained precipitates are dried and dispersed in ethanol to prepare an ethanol dispersion of graphene-containing substance.

A layered structure of ITO (thickness: 45 nm)/silver alloy (thickness: 10 nm)/ITO (thickness: 45 nm) provided on a PET film of about 180 μm thickness is coated with the above ethanol dispersion by the meniscus coating process with a bar-coater placed at a distance of 500 μm from the substrate. The coating film is then dried with an infrared heater to produce a graphene-containing membrane.

Figure 7:
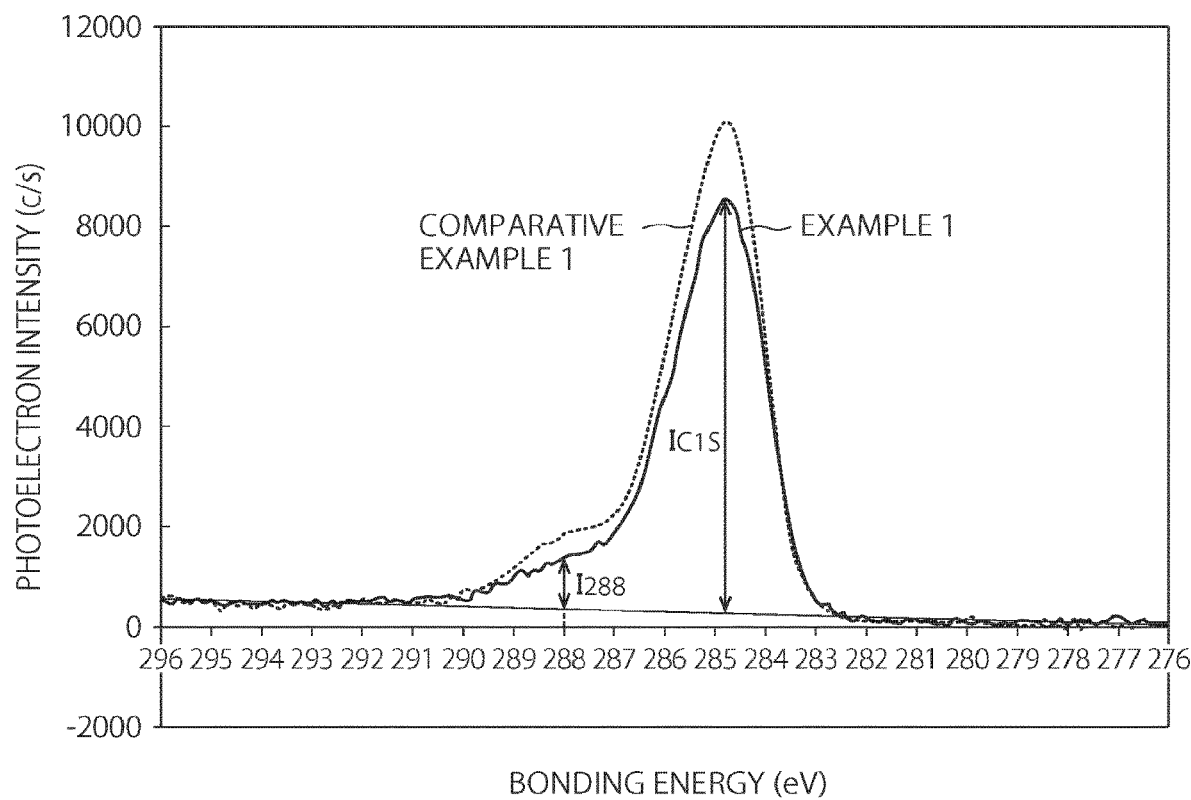
FIG. 7 shows C1s XPS spectra of graphene-containing membranes in Example 1 and Comparative example 1.
Figure 8:
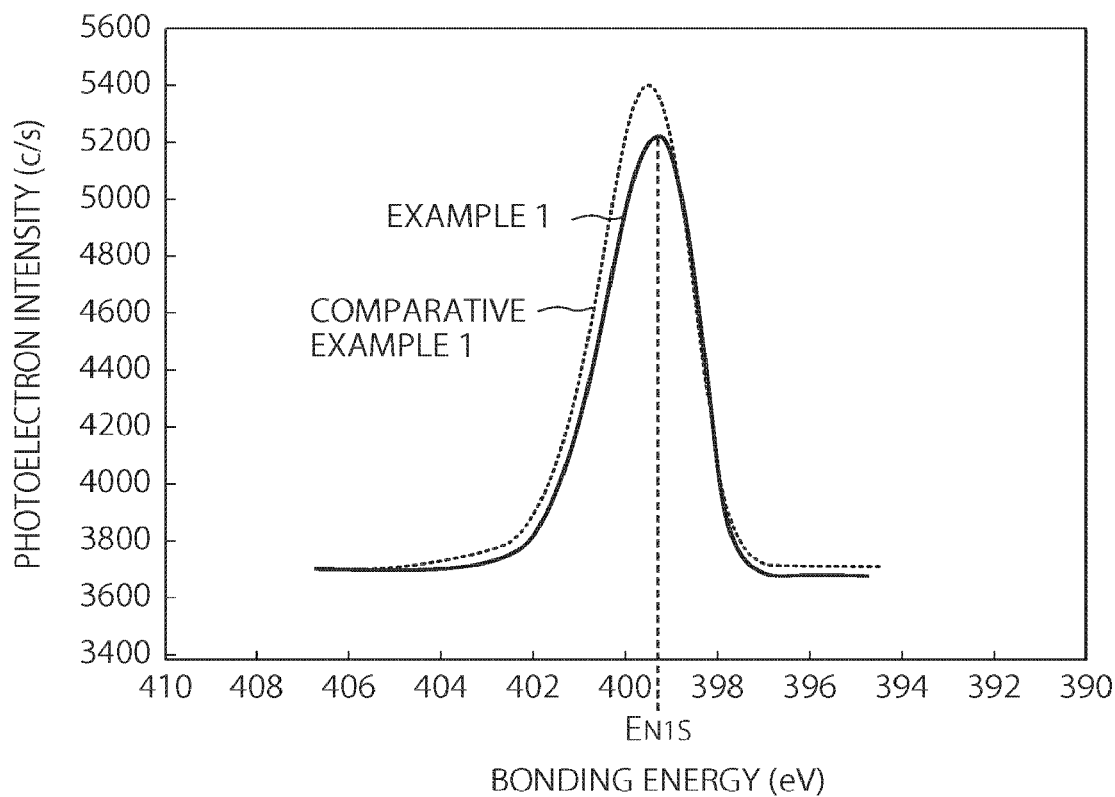
FIG. 8 shows N1s XPS spectra of graphene-containing membranes in Example 1 and Comparative example 1.

From XPS measurement, the content of the nitrogen atoms is found to be 12% of the carbon atoms. In this case, the membrane contains many nitrogen atoms coming from the polyethyleneimine. From IR spectroscopy, it is found that the graphene is linked with an alkyl chain. Further, from UPS measurement, the work function is found to be 3.7 eV. FIGS. 7 and 8 show XPS spectra corresponding to C1s and N1s, respectively. The values of $R_{C1s}$ and $E_{N1s}$ are found to be 7.1 and 399.3 eV from FIGS. 7 and 8, respectively.

A titanium wire is fixed on the graphene-containing membrane formed on the ITO/silver alloy/ITO/PET with silver paste so that they can be electrically connected. The bonding part is protected with a silicone tape, and the back surface of the PET film is also protected with a silicone tape. The thus-prepared sample is immersed in a 3 mass % aqueous sodium chloride solution and subjected to cyclic voltammetry. In the meantime, a sample prepared by only heating with the infrared heater as a sample not comprising the graphene-containing membrane is subjected to cyclic voltammetry in the same manner. From the waveform area on the positive potential side, the reaction amount between chloride ions and silver, namely, the integrated charge amount can be obtained. As a result, the integrated charge amount Q1 of the sample (1) having the graphene-containing membrane is found to be 3% or less based on that Q0 of the sample (2) not having the graphene-containing membrane. This indicates that chloride ions are shielded in the presence of the graphene-containing membrane.

Figure 9:
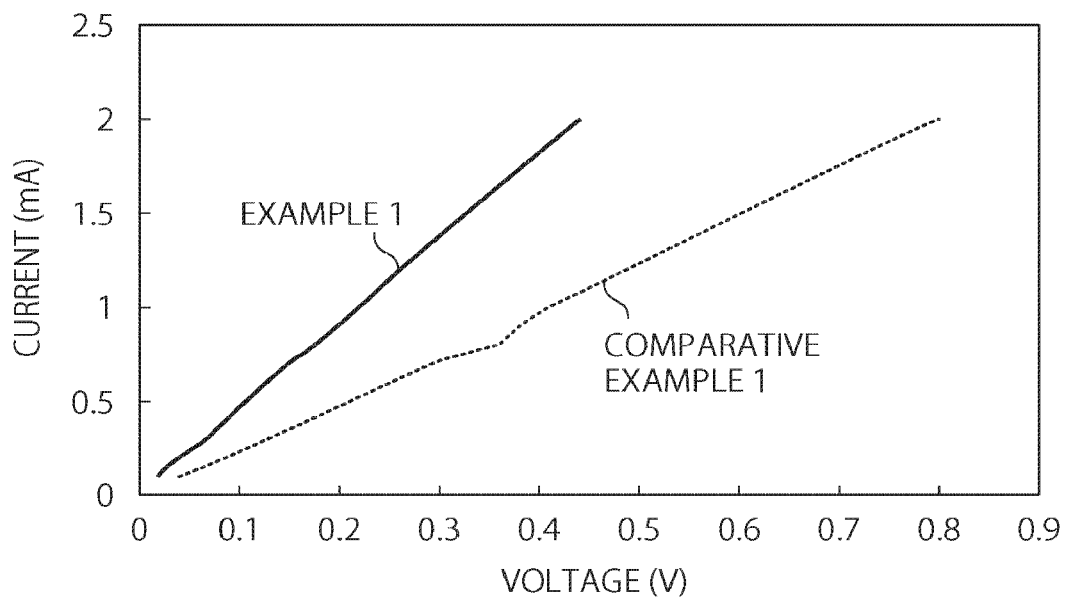
FIG. 9 shows voltage-current curves of graphene-containing membranes in Example 1 and Comparative example 1.

Independently, a Pt comb-like electrode of 10 μm-pitch is formed on a glass plate, then drop-coated with the above ethanol dispersion, and thereafter dried at 120° C. on a hotplate. Subsequently, the voltage-current curve of the obtained sample is measured by use of a DC power supply. FIG. 9 shows the result.

Comparative Example 1

The procedure of Example 1 is repeated except for not adding hydrazine hydrate, to produce a graphene-containing membrane. FIGS. 7 and 8 show XPS spectra corresponding to C1s and N1s, respectively. The values of $R_{C1s}$ and $E_{N1s}$ are found to be 5.2 and 399.7 eV from FIGS. 7 and 8, respectively.

Independently, a Pt comb-like electrode of 10 μm-pitch is formed on a glass plate, then drop-coated with the above ethanol dispersion and dried at 120° C. on a hotplate. Subsequently, the voltage-current curve of the obtained sample is measured by use of a DC power supply. FIG. 9 shows the result. The electric resistance is found to be about twice as large as that of Example 1. Further, the work function is found to be 3.8 eV, which is slightly larger than that of Example 1. Those indicate that this sample is inferior to that of Example 1 in suitability as a negative electrode material.

Example 2

The procedure of Example 1 is repeated to form a graphene-containing membrane on the layered structure of ITO/silver alloy/ITO. The membrane is then coated with an aqueous dispersion of graphene oxide by the meniscus coating process with a bar-coater placed at a distance of 500 μm from the substrate, and thereafter dried with an infrared heater to produce a laminate. From UPS measurement, the work function is found to be 4.9 eV, which indicates that the laminate is suitable as a positive electrode material.

Example 3

The procedure of Comparative example 1 is repeated to form a graphene-containing membrane on the layered structure of ITO/silver alloy/ITO. The membrane is then coated with an aqueous dispersion of graphene oxide by the meniscus coating process with a bar-coater placed at a distance of 500 μm from the substrate, and thereafter dried with an infrared heater to produce a laminate. From UPS measurement, the work function is found to be 4.7 eV, which indicates that the laminate is usable as a positive electrode material.

Example 4

Into 30 g of a graphene oxide aqueous dispersion containing monolayer graphene oxide sheets in an amount of 80 mass % or more (concentration: 0.05 wt %), 0.5 g of a branched polyethyleneimine aqueous solution (concentration: 10 wt %) is added. The mixture is heated at 90° C. for 1 hour, then 0.2 g of hydrazine hydrate is added therein, and thereafter the mixture is further heated at 90° C. for 30 hours. The resultant mixture is centrifuged at 12000 rpm to obtain precipitates, which are then dispersed again in water. The dispersion is centrifuged at 12000 rpm to obtain precipitates. This procedure is repeated twice to remove unreacted polyethyleneimine and hydrazine hydrate. The obtained precipitates are dried and dispersed in water to prepare an aqueous dispersion of graphene-containing substance.

A layered structure of ITO (thickness: 45 nm)/silver alloy (thickness: 10 nm)/ITO (thickness: 45 nm) provided on a PET film of about 180 μm thickness is subjected to UV-ozone treatment, and then coated with the above aqueous dispersion by the meniscus coating process with a bar-coater placed at a distance of 500 μm from the substrate. The coating film is then dried with an infrared heater to produce a graphene-containing membrane.

The values of $R_{C1s}$ and $E_{N1s}$ are found to be 6.2 and 399.5 eV, respectively. Further, the work function is found to be 3.8 eV, and the electric resistance is found to be about 1.2 times as large as that of Example 1. Although the resistance is slightly larger than that of Example 1, this sample is suitable as a negative electrode material.

Example 5

In the same manner as in Example 1, a graphene-containing membrane is formed on a PET film. The membrane is then coated with an isopropanol dispersion of silver nanowires having a diameter of 20 nm by the meniscus coating process with a bar-coater. The coating film is then dried with an infrared heater, and thereafter another graphene-containing membrane is further formed thereon in the same manner as in Example 1. The obtained sample is found to have a work function of 3.7 eV and hence is suitable as a negative electrode material.

A titanium wire is fixed on the graphene-containing membrane with silver paste so that they can be electrically connected. The bonding part is protected with a silicone tape, and the back surface of the PET film is also protected with a silicone tape. The thus-prepared sample is immersed in a 3 mass % aqueous sodium chloride solution and subjected to cyclic voltammetry. In the meantime, a sample not having the upper graphene-containing membrane is subjected to cyclic voltammetry in the same manner. From the waveform area on the positive potential side, the reaction amount between chloride ions and silver, namely, the integrated charge amount can be obtained. As a result, the integrated charge amount Q1 of the sample (1) having the graphene-containing membrane is found to be 1% or less based on that Q0 of the sample (2) only subjected to heating and not having the graphene-containing membrane. This indicates that chloride ions are shielded in the presence of the graphene-containing membrane.

Example 6

Figure 10:
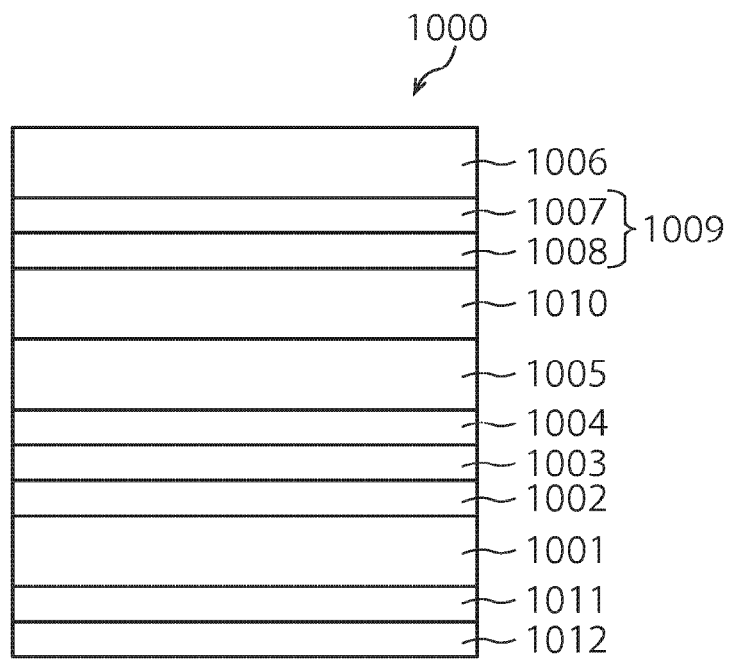
FIG. 10 is a schematic sectional view showing the structure of a solar cell in Example 6.

A solar cell 1000 shown in FIG. 10 is produced.

A layered structure 1002 of ITO (thickness: 45 nm)/silver alloy (thickness: 10 nm)/ITO (thickness: 45 nm) and a graphene-containing membrane 1003 provided thereon are formed on a PET film 1001. The graphene-containing membrane is formed in the same manner as in Example 1. On the membrane, a toluene solution of C60-PCBN is applied with a bar coater and then dried to form an electron transport layer 1004. Subsequently, a chlorobenzene solution containing poly(3-hexyl-thiophene-2,5-diyl) (hereinafter, referred to as "P3HT") and C60-PCBM is applied with a bar-coater, and dried with infrared light to form a photoelectric conversion layer 1005.

One surface of a stainless steel foil 1006 provided with an insulating ceramic film formed on the other surface is treated with diluted hydrochloric acid to remove the surface oxide film, then coated with the ethanol dispersion of graphene-containing substance obtained in Example 1 by the meniscus coating process, and subsequently dried with infrared light to form a graphene-containing membrane 1007. Further, an aqueous solution of graphene oxide is applied thereon by the meniscus coating process and then dried with infrared light to form a graphene oxide film 1008. Thus, a laminate 1009 comprising the graphene-containing membrane and the graphene oxide film is produced.

On the laminate 1009, an aqueous PEDOT•PSS solution containing sorbitol is applied with a bar coater and dried with infrared light to form a layer 1010 containing PEDOT•PSS (thickness: 50 nm). This layer functions as both a hole transport layer and an adhesive layer.

The thus-prepared laminate is then so adhered at 90° C. on the photoelectric conversion layer 1005 that the above adhesive layer 1010 may be in contact with the conversion layer 1005. UV-cut ink containing 2-hydroxy-4-methoxybenzophenone is screen-printed on the surface of the PET film to form a UV-cut layer 1011, on which a silica film is then formed by vacuum deposition to form a gas-barrier layer 1012. Finally, the boundary is sealed to produce a solar cell 1000.

The thus-produced solar cell shows an energy conversion efficiency of 6% or more under 1 SUN solar light illumination, and the efficiency deteriorates by less than 5% even after the solar cell is left outdoor for 1 month.

Example 7

The procedure of Example 6 is repeated except that the ethanol dispersion of graphene-containing substance obtained in Example 1 is replaced with that obtained in Comparative example 1, to produce a solar cell.

The thus-produced solar cell shows an energy conversion efficiency of 4% or more under 1 SUN solar light illumination.

Example 8

Figure 11:
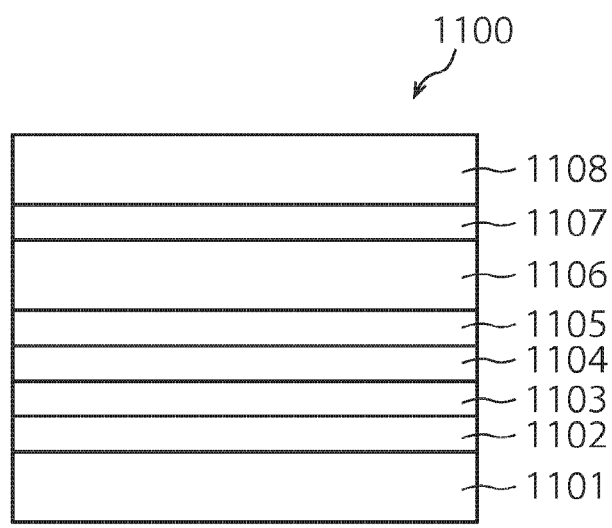
FIG. 11 is a schematic sectional view showing the structure of an organic EL device in Example 8.

An organic EL device 1100 shown in FIG. 11 is produced.

The layered structure of graphene-containing membrane 1102/silver nanowires 1103/graphene-containing membrane 1104 formed on a PET film 1101, which is obtained in Example 5, is coated with a toluene solution of C60-PCBN with a bar coater and then dried to form an electron transport layer 1105, on which tris(8-hydroxyquinoline)aluminum (Alq$_3$) (40 nm) is vapor-deposited to form a photoelectric conversion layer 1106. Further, N,N'-di-1-naphthyl-N,N'-diphenyl-1,1'-biphenyl-4,4'-diamine (hereinafter, referred to as "NPD") is vapor-deposited thereon in a thickness of 30 nm to form a hole transport layer 1107. Furthermore, a gold electrode 1108 is formed thereon by sputtering. Finally, the boundary is sealed to produce an organic EL device.

The obtained organic EL device is of high brightness and hardly deteriorates in output light. Specifically, even after continuous running for 1000 hours, the output falls by 5% or less.

Example 9

Figure 12:
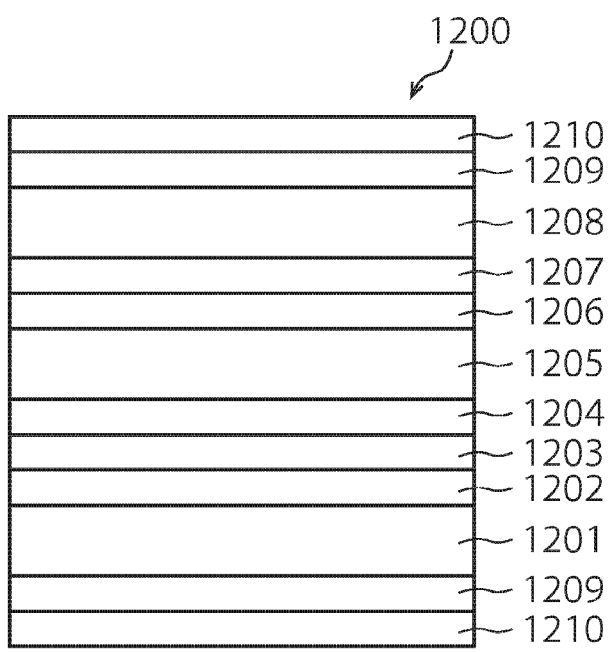
FIG. 12 is a schematic sectional view showing the structure of a solar cell in Example 9.

A transparent solar cell 1200 shown in FIG. 12 is produced.

A graphene-containing membrane 1203 is overlaid on the layered structure 1202 of ITO (thickness: 45 nm)/silver alloy (thickness: 10 nm)/ITO (thickness: 45 nm) provided on a PET film 1201, which is obtained in Example 1, then coated with a toluene solution of C60-PCBN with a bar coater, and thereafter dried to form an electron transport layer 1204. Subsequently, a chlorobenzene solution containing poly(3-hexyl-thiophene-2,5-diyl) (hereinafter, referred to as "P3HT") and C60-PCBM is applied thereon with a bar-coater, and dried with infrared light to form a photoelectric conversion layer 1205, on which an aqueous PEDOT•PSS solution is then applied with a bar coater and dried with infrared light to form a hole transport layer 1206 (thickness: 50 nm).

Independently, a Teflon sheet is coated with silver nanowires by the meniscus coating process and then dried. Subsequently, the Teflon sheet is brought into contact with the hole transport layer 1206 at 70° C. and thereby the silver nanowires are transferred onto the hole transport layer 1206 to produce an upper transparent electrode 1207, which is then covered with a PET film 1208.

On both surfaces of the thus-obtained laminate, UV-cut ink containing 2-hydroxy-4-methoxybenzo-phenone is screen-printed to form UV-cut layers 1209, on which silica films are then respectively formed by vacuum deposition to form gas-barrier layers 1210. Finally, the boundary is sealed to produce a transparent solar cell 1200.

The obtained solar cell is transparent and shows an energy conversion efficiency of 3% or more under 1 SUN solar light illumination. The efficiency deteriorates by less than 5% even after the solar cell is left outdoor for 1 month.

Example 10

Into 30 g of a graphene oxide aqueous dispersion containing monolayer graphene oxide sheets in an amount of 80 mass % or more (concentration: 0.05 wt %), 2 g of a branched polyethyleneimine aqueous solution (concentration: 10 wt %) is added. The mixture is heated at 90° C. for 1.5 hours, then 2 g of 5% sodium borohydride aqueous solution is added therein, and thereafter the mixture is further heated at 90° C. for 30 minutes. The resultant mixture is centrifuged at 12000 rpm to obtain precipitates, which are then dispersed again in water. The dispersion is centrifuged at 12000 rpm to obtain precipitates. This procedure is repeated twice to remove unreacted polyethyleneimine and sodium borohydride. The obtained precipitates are dried and dispersed in 2-propanol to prepare a 2-propanol dispersion of graphene-containing substance.

A layered structure of ITO (thickness: 45 nm)/silver alloy (thickness: 10 nm)/ITO (thickness: 45 nm) provided on a PET film of about 180 μm thickness is coated with the above 2-propanol dispersion by the meniscus coating process with a bar-coater placed at a distance of 500 μm from the substrate. The coating film is then dried with an infrared heater to produce a graphene-containing membrane.

The above graphene-containing membrane is then coated with an aqueous dispersion of graphene oxide by the meniscus coating process with a bar-coater placed at a distance of 500 μm from the substrate, and thereafter dried with an infrared heater to produce a graphene-containing membrane laminate. From UPS measurement, the work function is found to be 4.8 eV, which indicates that the laminate is suitable as a positive electrode material.

Example 11

Figure 13:
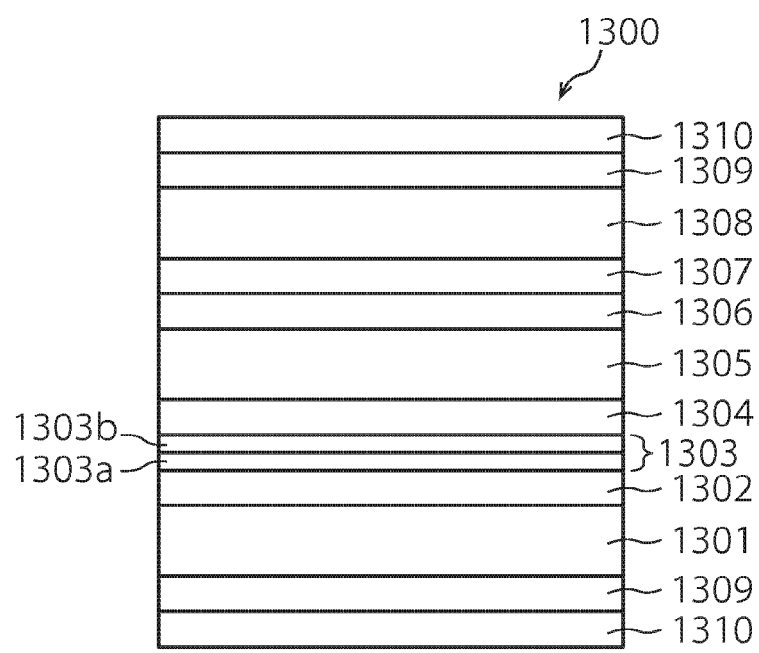
FIG. 13 is a schematic sectional view showing the structure of a solar cell in Example 11.

A solar cell 1300 shown in FIG. 13 is produced.

The layered structure 1302 of ITO (thickness: 45 nm)/silver alloy (thickness: 10 nm)/ITO (thickness: 45 nm) provided on a PET film 1301, which is obtained in Example 10, and a graphene-containing membrane laminate 1303 comprising a graphene-containing membrane 1303a/a graphene oxide film 1303b are stacked. Further, an aqueous PEDOT•PSS solution is then applied thereon with a bar coater and dried with infrared light to form a PEDOT•PSS-containing hole transport layer 1304, and thereafter a chlorobenzene solution containing poly(3-hexylthiophene-2,5-diyl) (hereinafter, referred to as "P3HT") and C60-PCBM is furthermore applied thereon with a bar-coater and dried with infrared light to form a photoelectric conversion layer 1305.

On the above photoelectric conversion layer 1305, a 2-propanol dispersion of tin oxide nanoparticles is applied with a bar-coater and then dried to form an electron transport layer 1306. Further, silver is vapor-deposited thereon to form a counter electrode (negative electrode) 1307, which is then covered with a sealing film 1308 with a gas-barrier layer.

UV-cut ink containing 2-hydroxy-4-methoxybenzo-phenone is screen-printed on the surface of the PET film to form a UV-cut layer 1309, on which a silica film is then formed by vacuum deposition to form a gas-barrier layer 1310. Finally, the boundary is sealed to produce a solar cell 1300.

The obtained solar cell shows an energy conversion efficiency of 5% or more under 1 SUN solar light illumination, and the efficiency deteriorates by less than 5% even after the solar cell is left outdoor for 1 month.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the invention.

The invention claimed is:

1. A graphene-containing membrane containing graphene in which polyalkyleneimine chains are connected to the graphene skeleton; which has a ratio of the photoelectron intensity at the energy peak position of C1s orbital to that at the bonding energy on an X-ray photoelectron spectrum measured on an ITO film of 288 eV in a range of 5.5 to 20.

2. The graphene-containing membrane according to claim 1, wherein said X-ray photoelectron spectrum measured on an ITO film indicates the bonding energy of the peak corresponding to N1s orbital in the range of 399.0 to 399.5 eV.

3. The graphene-containing membrane according to claim 1, which has a work function of 4 eV or less according to ultraviolet photoelectron spectroscopy measurement.

4. A photoelectric conversion device comprising a negative electrode, a positive electrode, a photoelectric conversion layer provided between said negative electrode and said positive electrode, and a graphene-containing membrane provided between said negative electrode and said photoelectric conversion layer; wherein said graphene-containing membrane contains graphene in which polyalkyleneimine chains are connected to the graphene skeleton and has a ratio of the photoelectron intensity at the energy peak position of C1s orbital to that at the bonding energy on an X-ray photoelectron spectrum measured on an ITO film of 288 eV in a range of 5.5 to 20.

5. The device according to claim 4, wherein said X-ray photoelectron spectrum measured on an ITO film indicates the bonding energy corresponding to N1s orbital in the range of 399.0 to 399.5 eV.

6. The device according to claim 4, wherein said graphene-containing membrane has a work function of 4 eV or less according to ultraviolet photoelectron spectroscopy measurement.

7. The device according to claim 4, wherein at least one of said negative electrode and said positive electrode contains silver.

8. The device according to claim 4, wherein at least one of said negative electrode and said positive electrode is a transparent electrode containing indium-tin oxide.

* * * * *